United States Patent
Deng et al.

(10) Patent No.: US 12,211,570 B2
(45) Date of Patent: Jan. 28, 2025

(54) TEST CIRCUIT AND METHOD FOR READING DATA FROM A MEMORY DEVICE DURING MEMORY DUMP

(71) Applicant: Realtek Semiconductor Corp., HsinChu (TW)

(72) Inventors: Li-Wei Deng, HsinChu (TW); Ying-Yen Chen, HsinChu (TW); Chih-Tung Chen, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 116 days.

(21) Appl. No.: 18/129,087

(22) Filed: Mar. 31, 2023

(65) Prior Publication Data

US 2023/0335208 A1 Oct. 19, 2023

(30) Foreign Application Priority Data

Apr. 19, 2022 (TW) .................................. 111114835

(51) Int. Cl.
*G11C 29/00* (2006.01)
*G11C 7/10* (2006.01)
(Continued)

(52) U.S. Cl.
CPC ............ *G11C 29/10* (2013.01); *G11C 7/1069* (2013.01); *G11C 29/12015* (2013.01)

(58) Field of Classification Search
CPC .... G06F 11/27; G06F 11/366; G06F 11/3656; G06F 13/4282; G06F 2213/0042; G06F 11/221; G06F 11/2215; G06F 11/2273; G06F 11/25; G06F 11/0778; G06F 1/04; G06F 1/30; G06F 11/20; G06F 11/261; G06F 12/14; G06F 13/4022; G06F 15/16; G06F 15/78; G06F 15/8038; G06F 3/061; G06F 3/0629; G06F 3/0655; G06F 3/0673; G06F 9/4812; G06F 9/4825;
(Continued)

(56) References Cited

U.S. PATENT DOCUMENTS

| | | | |
|---|---|---|---|
| 8,589,749 B1 | 11/2013 | Yu | |
| 8,788,886 B2 | 7/2014 | Chong | |
| 10,331,530 B2 * | 6/2019 | Broutin | G06F 11/0778 |

OTHER PUBLICATIONS

Vishnu C Vimjam, Using Scan-Dump Values to Improve Functional-Diagnosis Methodology, IEEE VLSI Test Symmposium (VTS'07) ,Jun. 2007.

* cited by examiner

*Primary Examiner* — Thong Q Le
(74) *Attorney, Agent, or Firm* — Winston Hsu

(57) ABSTRACT

A test circuit coupled to a memory device and configured to read data stored in the memory device during a memory dump, includes a dump controller and a pattern generator. The dump controller triggers the pattern generator to start a pattern generating operation in response to a setting of memory dump mode by a processor. The pattern generator generates multiple control signals in the pattern generating operation and provides the control signals to the memory device. The control signals include an address signal, a memory enable signal and a read enable signal. The address signal includes multiple memory addresses arranged in multiple consecutive clock cycles of the processor. The consecutive clock cycles of the processor is provided to read the data stored in the memory addresses.

14 Claims, 8 Drawing Sheets

(51) Int. Cl.
*G11C 29/10* (2006.01)
*G11C 29/12* (2006.01)

(58) Field of Classification Search
CPC .............. G11C 29/12015; G11C 29/36; G11C 11/4082; G11C 2029/3202; G11C 29/1201; G11C 29/32; G11C 29/42; G11C 7/1039; G11C 7/1051; G11C 7/22; G11C 11/419; G11C 2207/007; G11C 29/48; G11C 29/56004; G11C 5/066; G11C 7/1084; G11C 29/56008; G11C 2029/3602; G11C 29/10; G11C 29/12; G11C 7/1069; G11C 7/24; G11C 15/04; G11C 29/00; G11C 29/08; G11C 29/56012
See application file for complete search history.

TEST CIRCUIT AND METHOD FOR READING DATA FROM A MEMORY DEVICE DURING MEMORY DUMP

BACKGROUND OF THE INVENTION

1. Field of the Invention

The invention relates to a circuit and a method for performing memory dump.

2. Description of the Prior Art

Memory dump and scan dump operations are two common operations performed on a development board to diagnose a fabricated chip. When an error or unexpected exception has occurred, these operations are utilized during a debugging stage to determine the cause of malfunction. The scan dump may involve operations of reading out all of the values stored in the registers, and the memory dump may involve operations of reading out the content stored in all memories of the chip. When an error or unexpected exception has occurred, the system turns off the chip's clocks and turns on another scan clock with lower frequency to perform the scan dump and memory dump.

In the scan dump operation, the content of each register are sequentially shifted out to an output scan pin in a concatenated manner. Similarly, in the memory dump operation, a portion of or all the content in the memories of the chip are read and output. By analyzing the dumped content, for example, comparing them with a golden pattern generated by a host simulator under the same condition, the root cause of the error or unexpected exception may be determined.

Since usually all the content stored in the memory has to be read out in the memory dump operation and it takes a long time for a device outside of the chip to execute the dump command, as the number of memories configured in the chip increases, the time required to perform the memory dump operations increases greatly as well, resulting in a problem of excessive time-consuming in memory dump operation.

To solve this problem, a circuit and a method for effectively performing memory dump operation are required.

SUMMARY OF THE INVENTION

An objective of the invention is to focus on the problem of excessive time-consuming in memory dump operation. A circuit and method for efficiently performing memory dump are therefore provided.

According to an embodiment of the invention, a test circuit coupled to a memory device and configured to read data stored in the memory device during a memory dump operation and comprises a dump controller and a pattern generator. The dump controller is configured to trigger the pattern generator to start a pattern generating operation in response to a setting of a memory dump mode performed by a processor. The pattern generator is configured to generate a plurality of control signals in the pattern generating operation and provide the plurality of control signals to the memory device. The plurality of control signals at least comprise an address signal, a memory enable signal and a read enable signal, the address signal comprises a plurality of memory addresses arranged in a plurality of consecutive clock cycles of the processor to read the data stored in the plurality of memory addresses in the plurality of consecutive clock cycles.

According to an alternative embodiment of the invention, a method for reading data stored in a memory device during a memory dump operation comprises: generating a plurality of control signals in response to a setting of a memory dump mode performed by a processor, wherein the plurality of control signals at least comprise an address signal, a memory enable signal and a read enable signal, and the address signal comprises a plurality of memory addresses arranged in a plurality of consecutive clock cycles of the processor to read the data stored in the plurality of memory addresses in the plurality of consecutive clock cycles; providing the plurality of control signals to the memory device; and sequentially reading the data stored in the plurality of memory addresses in the plurality of consecutive clock cycles in response to the plurality of control signals.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
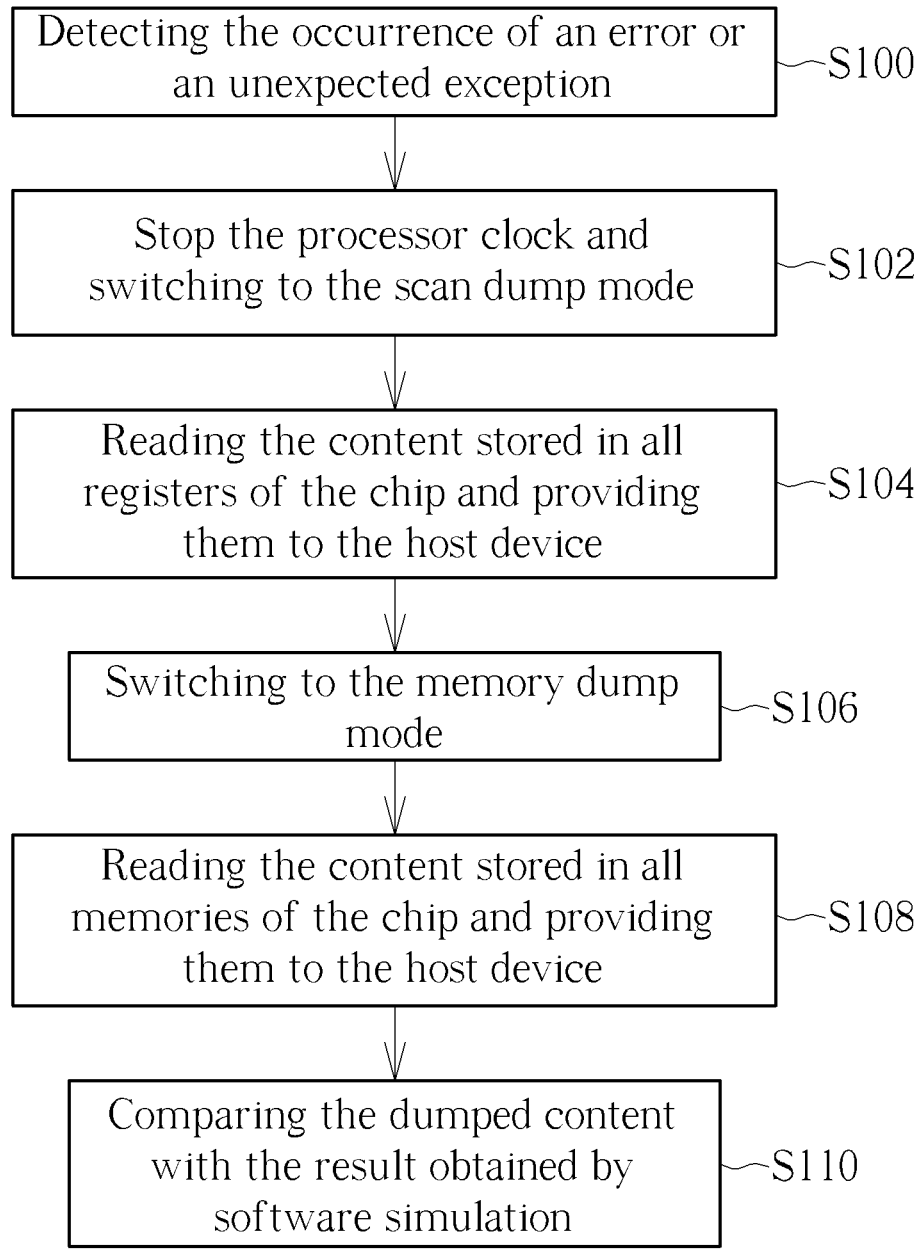
FIG. 1 illustrates an exemplary debug flow according to an embodiment of the invention.

FIG. 1 illustrates an exemplary debug flow according to an embodiment of the invention. Generally, in the testing stage of a chip, when an error or an unexpected exception has occurred during the operation of a processor (e.g., a central processing unit) configured inside of the chip, a debug operation is required and the debug flow may comprise the following processing steps:

Step S100: The occurrence of an error or an unexpected exception is detected. For example, the processor or the chip under test itself, or another host device coupled to the chip under test or coupled to a development board having the chip under test installed therein, may perform the detection by monitoring one or more debug ports.

Step S102: The processor clock is stopped or turned off and it is switched to a scan dump mode. At this time, another scan clock with a lower frequency is turned on to assist subsequent dump operations.

Step S104: The content stored in all registers (or the statuses of all registers) of the chip is read and provided to the host device.

Step S106: It is switched to the memory dump mode.

Step S108: The content stored in all memories of the chip is read and provided to the host device.

Step S110: The dumped content is compared with the result obtained by software simulation (e.g., the golden pattern generated by the simulator under the same conditions) performed on the host device to determine the cause of the error or exception.

In the process similar to the memory read operation involved in step S108, the processor of the conventional design (e.g., the processor configured inside of the chip) must issue a dedicated read command for each memory address, and then sequentially provide the read data corresponding to each memory address to the host device through a test interface, such as IEEE1149.1 Joint Test Action Group (JTAG).

However, for each read command issued by the processor, it usually takes several (e.g., 3-5) clock cycles of the processor clock to complete the corresponding read operation. The reason is that the commands issued by the processor must undergo decoding and some other processes. As the number of memories configured in the chip increases, the time required for performing the memory dump operation will increase significantly, causing the problem that the memory dump operation is excessively time-consuming.

To solve this problem, a circuit and a corresponding method for efficiently performing memory dump are proposed. In one embodiment of the invention, a test circuit is utilized to perform memory dump related operations (e.g., the operations in the aforementioned step S108), and the proposed test circuit may be a Memory Built-in Self Test (MBIST) circuit. In the embodiments of the invention, the test circuit or the MBIST circuit may be configured with a corresponding test algorithm to complete the required memory read operations in the memory dump mode, and different from the conventional design, in the embodiments of the invention, it only takes one processor clock cycle to complete the read operation of a memory address. That is, in the embodiments of the invention, it is not necessary for the processor to sequentially issue the dedicated read command for each memory address, but the test circuit or MBIST circuit automatically performs and completes the read operations of all memory addresses, and the read operation of one memory address can be completed within one clock cycle of the processor. In this manner, compared with the conventional design that requires multiple clock cycles to complete the read operation of one memory address, the execution time of memory dump is greatly shortened by applying the proposed circuit and the corresponding method.

Figure 2:
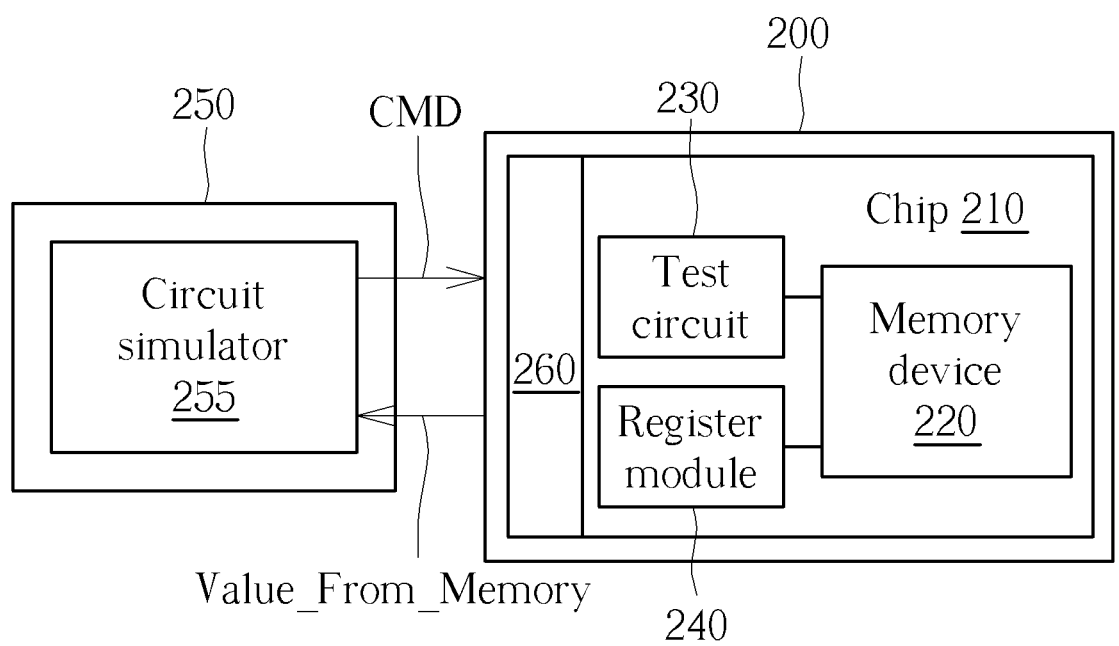
FIG. 2 illustrates an exemplary block diagram of a system according to an embodiment of the invention.

FIG. 2 illustrates an exemplary block diagram of a system according to an embodiment of the invention. The system mentioned here may comprise a development board 200 and a host device 250, wherein the development board 200 may also be a system-on-chip (SoC) platform. The processor (not shown in FIG. 2) of the host device 250 may realize a circuit simulator 255 by executing corresponding software. The development board 200 may be installed with a chip 210 under test, and the chip 210 may comprise a memory device 220, a test circuit 230 and a register module 240. The processor of the host device 250 may transmit the command CMD to the test interface 260, such as the aforementioned JTEG, through the corresponding bus and receive the read data through the test interface 260 and the corresponding bus, such as the value Value_From_Memory read from the memory device shown in FIG. 2. It is to be noted that, in order to clarify the concept of the invention, FIG. 2 presents a simplified block diagram in which only the components relevant to the invention are shown. Those skilled in the art can understand that the host device and the chip may further comprise many components or devices not shown in FIG. 2 to implement corresponding signal processing functions. In addition, in an embodiment of the invention, the test circuit 230 may be an MBIST circuit dedicatedly configured for the memory device 220.

In an embodiment of the invention, when the processor of the host device 250 issues a command to switch an operation mode to the memory dump mode for performing memory dump, the chip 210 under test performs the read operations on different memory addresses to sequentially read the values stored therein through the test circuit 230 installed therein, and stores the values read from the memory device in the register module 240. When the data stored in the register module 240 reaches a certain level, the data stored in the register module 240 are read and output to the bus connected between the development board 200 and the host device 250, so as to be transmitted to the host device 250. It is to be noted that the embodiments of the invention are not limited to configure the register module 240 outside the testing circuit 230. In some embodiments of the invention, the register module 240 may also be configured inside the testing circuit 230.

Figure 3:
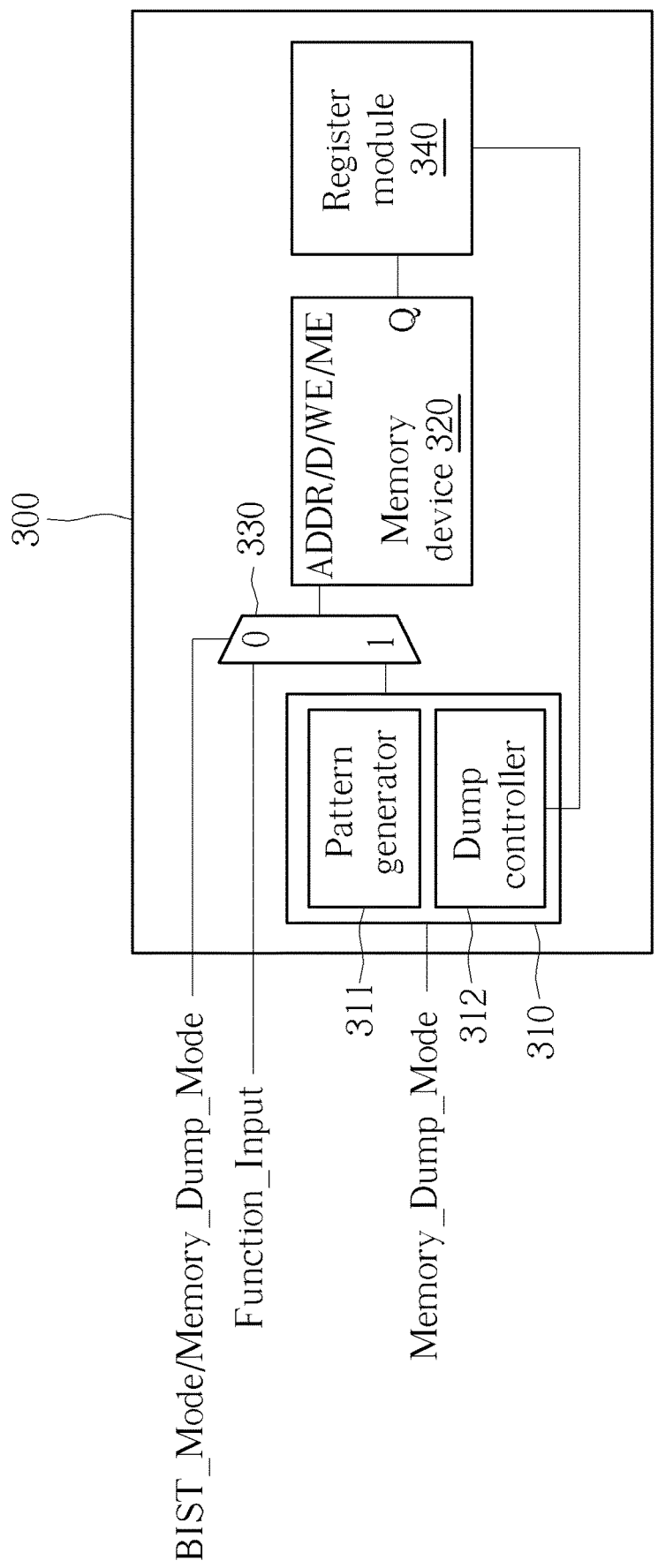
FIG. 3 illustrates an exemplary block diagram of a test circuit according to an embodiment of the invention.

FIG. 3 illustrates an exemplary block diagram of a test circuit according to an embodiment of the invention. The test circuit 300 is coupled to the memory device 320 for reading data stored in the memory device 320 in the memory dump operation. It is to be noted that, to illustrate the operation of the test circuit 300, the memory device 320 is also shown in FIG. 3. However, in actual implementation, the test circuit 300 may not comprise the memory device 320.

The test circuit 300 may comprise a control module 310, a multiplexer 330 and a register module 340. The control module 310 may comprise a pattern generator 311 and a dump controller 312. The dump controller 312 may be configured to trigger the pattern generator 311 to start a corresponding pattern generating operation in response to a setting of a memory dump mode performed by a processor (e.g., a processor configured in the chip comprising the test circuit 300). The multiplexer 330 may receive signals from a plurality of input sources and a selection signal, and select the signal(s) of one of the input sources to be output according to the setting of the selection signal. The plurality of input sources may comprise a pattern generated by the pattern generator 311 and a function input signal Function_Input generated by a processor (for example, the aforementioned processor configured in the chip, or a memory controller corresponding to the memory device 320).

In one embodiment of the invention, the test circuit 300 may be an MBIST circuit dedicatedly configured for the memory device 320. The selection signal received by the multiplexer 330 may be the setting signal BIST_Mode of the built-in self-test (BIST) mode or the setting signal Memory_Dump_Mode of the memory dump mode. For example, besides the communication port configured to receive the setting signal BIST_Mode, the test circuit 300 may comprise an additional communication port to receive the setting signal Memory_Dump_Mode.

When the test circuit 300 performs the BIST on the memory device 320, the processor of the chip may program the value of the register corresponding to the setting signal BIST_Mode (for example, set to 1) to control the multiplexer 330 to select the pattern generated by the pattern generator 311 as the output, and now the pattern is generated for the BIST. Similarly, when the test circuit 300 performs the memory dump operation on the memory device 320, the processor may program the value of the register corresponding to the setting signal Memory_Dump_Mode (for example, set to 1) to control the multiplexer 330 to select the pattern generated by the pattern generator 311 as the output, and now the pattern is generated for memory dump. When the test circuit 300 is neither performing BIST operation nor performing memory dump operation on the memory device 320, the processor may control the multiplexer 330 to select and output the function input signal Function_Input by setting the value of the register corresponding to the setting signal BIST_Mode to other values (e.g., set to 0).

According to an embodiment of the invention, in response to the issuing of the command by the host device to request the chip to switch to the memory dump mode, the processor of the chip may set the value of the register corresponding to the setting signal Memory_Dump_Mode to a predetermined value, e.g., set to 1 as mentioned above, to notify the test circuit 300 to switch the operation mode to the memory dump mode. The control module 310 may also receive this setting signal Memory_Dump_Mode, and the dump controller 312 may trigger the pattern generator 311 to start generating the patterns of the control signals required in the memory dump mode in response to the setting of the memory dump mode (e.g. the aforementioned predetermined value), and provide the control signals to the memory device 320.

In an embodiment of the invention, in the memory dump mode, the control signals generated by the pattern generator 311 may at least comprise an address signal ADDR, a memory enable signal ME and a read enable signal WE, wherein the read enable signal WE may also be regarded as a write enable signal. For example, one signal level of the read enable signal WE may be defined as the level to enable the write operation of the memory device, while another signal level of the read enable signal WE may be defined as the level to enable the read operation of the memory device. In the BIST mode, the control signal generated by the pattern generator 311 may further comprise the data signal D. In the memory dump mode, the pattern generator 311 may provide the control signals to the memory device 320 to control the memory device 320 to sequentially read the data stored in the corresponding memory address according to the content indicated by the address signal ADDR, and sequentially provide the read data to the register module 340 through the output communication port Q. The register module 340 may comprise one or more registers for sequentially receiving and storing the data. In an embodiment of the invention, the patterns of the control signals generated by the pattern generator 311 may be a sequence of patterns comprising only memory read operations.

Figure 4:
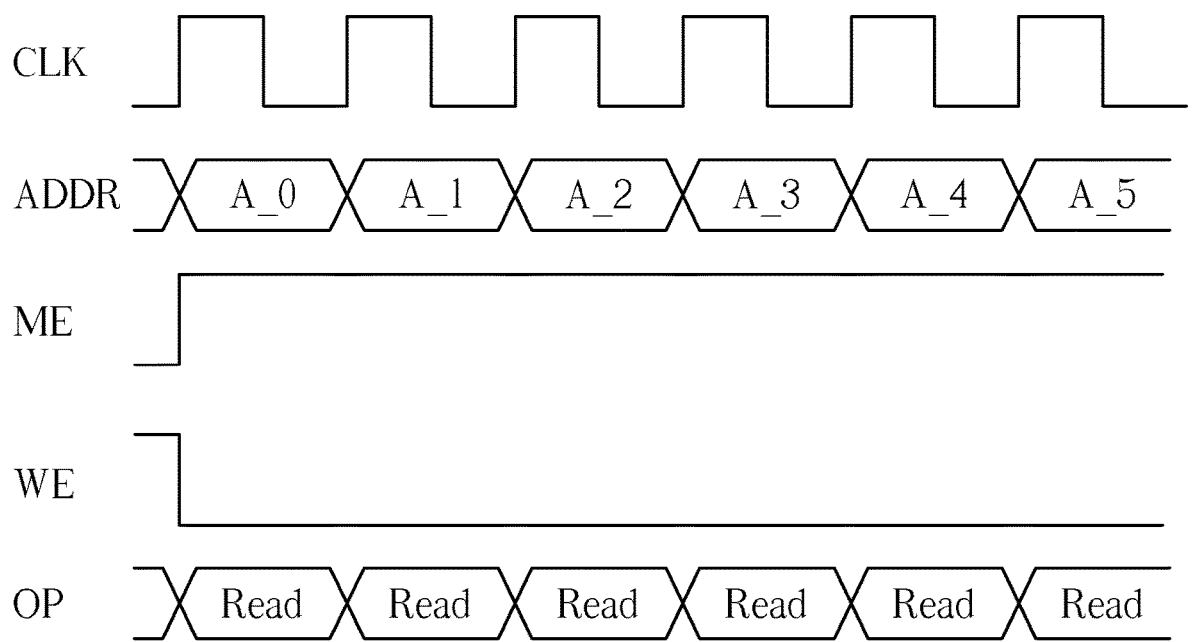
FIG. 4 is a diagram showing the exemplary waveforms of the control signals according to an embodiment of the invention.

FIG. 4 is a diagram showing the exemplary waveforms of the control signals according to an embodiment of the invention. In response to the setting of the memory dump mode, the pattern generator 311 may set the level of the memory enable signal ME to 1 (high level) to enable the memory device 320, and set the level of the read enable signal WE to 0 (low level) to enable the read operation of the memory device 320. In addition, FIG. 4 also shows the waveform of the clock signal CLK of the processor. The address signal ADDR generated by the pattern generator 311 in the memory dump mode may comprise a plurality of memory addresses, such as the memory addresses A_0~A_5 shown in FIG. 4, arranged in a plurality of consecutive clock cycles of the processor.

In an embodiment of the invention, by setting the pattern of the address signal ADDR, the pattern generator 311 may arrange the read operation of one memory address within one clock cycle of the processor, and in the pattern of the address signal ADDR, the pattern generator 311 may arrange a plurality of memory addresses, such as a plurality of consecutive memory addresses, in a plurality of consecutive clock cycles for sequentially reading data stored in these memory addresses one by one in consecutive clock cycles. As illustrated by the operation waveform OP in FIG. 4, a plurality of read operations Read will be performed continuously within a plurality of clock cycles. By arranging the memory addresses and the setting the corresponding patterns of other control signals, the test circuit 300 may complete a predetermined number of data read operations to read data from the memory device 320 within the predetermined number of clock cycles of the processor. Assuming that the memory space of the memory device 320 addressed by one memory address is able to store 128 bits of data, the test circuit 230/300 may complete the read operation of 128-bit data within one clock cycle of the processor, and the read operations corresponding to a predetermined number of memory addresses can be completed within the equal number of (i.e. the aforementioned predetermined number of) clock cycles of the processor in response to the aforementioned control signals, wherein the read data size in each read operation is 128 bits in this example, but the invention is not limited thereto.

An exemplary script that uses the test circuit or the MBIST circuit to automatically complete the memory dump is provided. In this example, the memory dump script includes P steps to read N memory addresses, and the corresponding descriptions are shown as the following steps:

Step 0: A memory dump command is sent by the host device.

Step 1: Memory dump is performed by the chip.

Step 2: (Internal operation of the test circuit) The first memory address of the memory device is read and the corresponding data is stored in the register by the test circuit.

Step 3: The read operation is performed on the register.

Step 4: The read data is transmitted to the host device.

( . . . omitted)

Step (P-3): (Internal operation of the test circuit) The (N-1) memory address of the memory device is read and the corresponding data is stored in the register by the test circuit.

Step (P-2): The read operation is performed on the register.

Step (P-1): The read data is transmitted to the host device.

Since, in the embodiments of the invention, the processor does not sequentially issue the read commands which are respectively for each memory address, but triggers the test circuit to enter and operate in the memory dump mode by setting the signal Memory_Dump_Mode and generate the corresponding patterns of control signals to perform the corresponding read operations. Therefore, in the embodiments of the invention, the operations of reading N memory addresses can be completed in a shorter time than the conventional design. As an example, the Step 1, Step 2 and Step 3 shown above all do not involve the operation of the processor.

Figure 5:
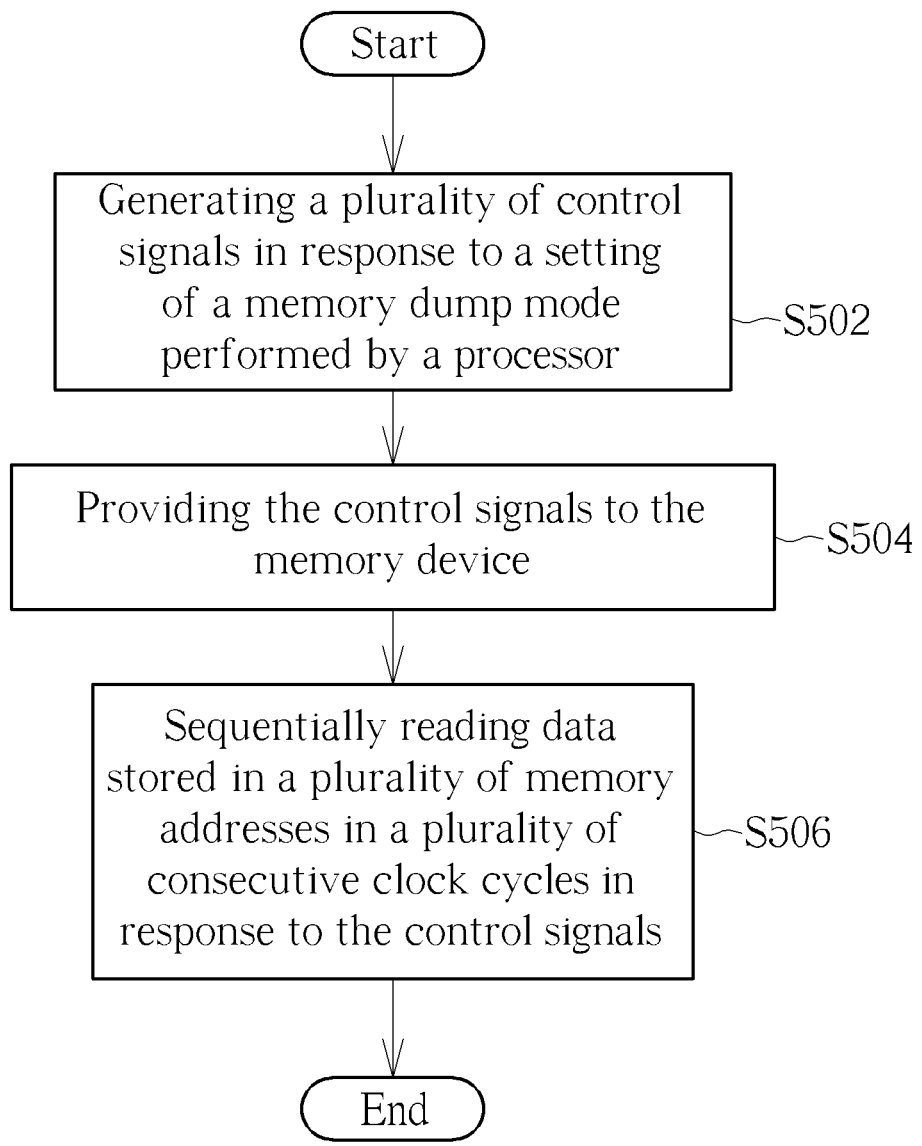
FIG. 5 shows an exemplary flow chart of a method for reading data stored in a memory device in a memory dump operation according to an embodiment of the invention.

FIG. 5 shows an exemplary flow chart of a method for reading data stored in a memory device in a memory dump operation according to an embodiment of the invention. The method comprises the following steps:

Step S502: A plurality of control signals are generated in response to a setting of a memory dump mode performed by a processor.

Step S504: The plurality of control signals are provided to the memory device.

Step S506: The data stored in a plurality of memory addresses is sequentially read in a plurality of consecutive clock cycles in response to the plurality of control signals.

In Step S506, within a predetermined number of clock cycles of the processor, the memory device sequentially outputs the data stored in the same number of (i.e., the predetermined number of) memory addresses.

According to an alternative embodiment of the invention, in addition to one or more registers, the register module may further comprise a scheduler for scheduling the receptions of data, and the scheduler may perform handshake with the control module to complete the serial output of the data (i.e., each piece of data being sequentially output) or parallel output of the data (i.e. multiple pieces of data being output at the same time).

Figure 6:
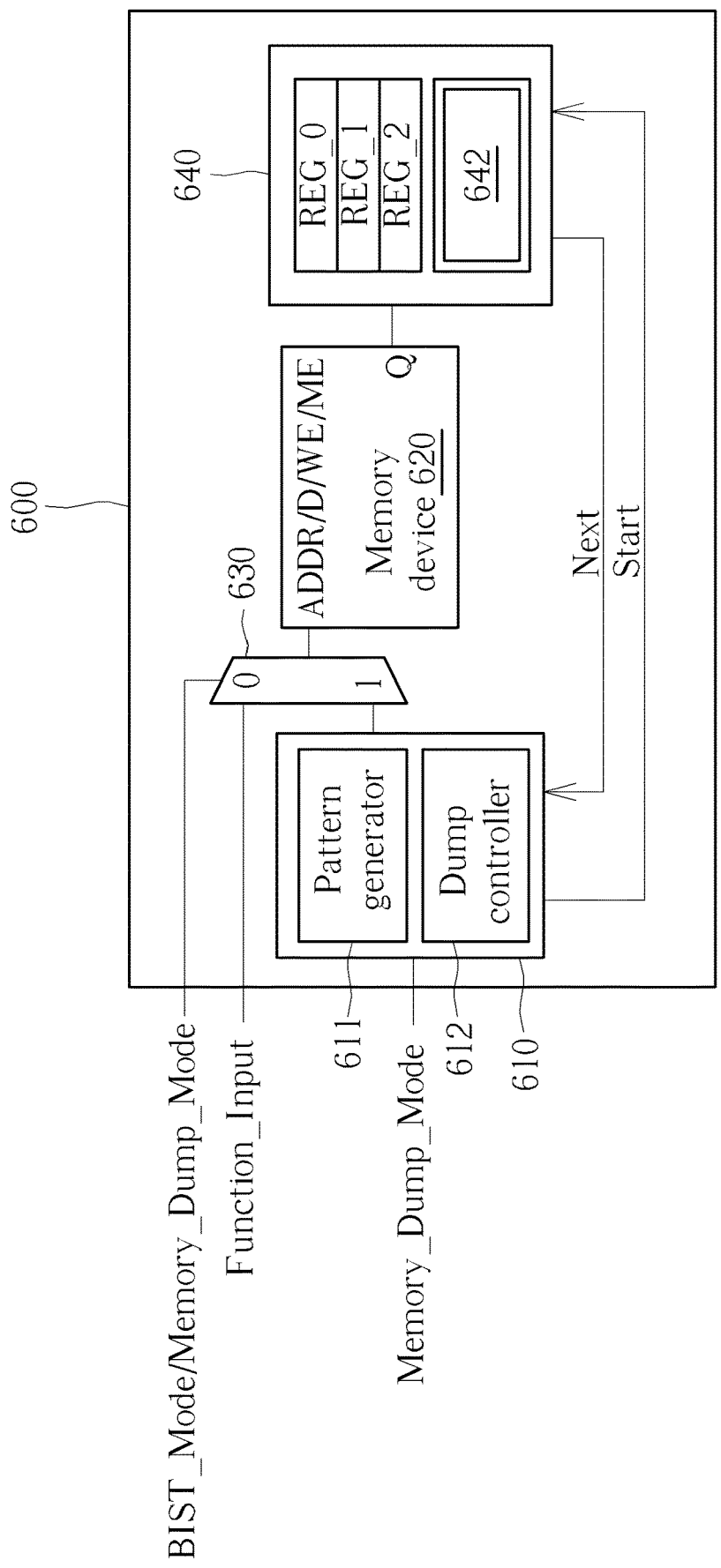
FIG. 6 illustrates an exemplary block diagram of a test circuit according to an alternative embodiment of the invention.

FIG. 6 illustrates an exemplary block diagram of a test circuit according to an alternative embodiment of the invention. The test circuit 600 is coupled to the memory device 620 for reading data stored in the memory device 620 in the memory dump operation. It is to be noted that, to illustrate the operation of the test circuit 600, the memory device 620 is also shown in FIG. 6. However, in actual implementation, the test circuit 600 may not comprise the memory device 620.

The test circuit 600 may comprise a control module 610, a multiplexer 630 and a register module 640. The control module 610 may comprise a pattern generator 611 and a dump controller 612. The dump controller 612 may be configured to generate a start signal Start (e.g., by generating a corresponding pulse) in response to a setting of a memory dump mode performed by a processor (e.g., a processor configured in the chip comprising the test circuit 600) and trigger the pattern generator 611 to start a corresponding pattern generating operation.

In one embodiment of the invention, the test circuit 600 may be an MBIST circuit dedicatedly configured for the memory device 620. The basic operations of the control module 610, the memory device 620, the multiplexer 630, the pattern generator 611 and the dump controller 612 are the same as those of the control module 310, the memory device 320, the multiplexer 330, the pattern generator 311 and the dump controller 312 as illustrated in FIG. 3, and the descriptions are omitted here for brevity.

According to an embodiment of the invention, the register module 640 may comprise a plurality of registers, such as the register REG_0, the register REG_1 and the register REG_2 and the scheduler 642 configured to schedule the receptions of data. It is to be noted that the number of registers shown in FIG. 6 is not a limit to the invention.

The control module 610 receives the setting signal Memory_Dump_Mode, and in response to the setting of the memory dump mode (e.g. the aforementioned predetermined value), the dump controller 612 generates the start signal Start and triggers the pattern generator 611 to start generating the patterns of the control signals required in the memory dump mode. The start signal Start is provided to the scheduler 642 to notify the start of the read operation, and the control signals are provided to the memory device 620 to control the read operations of the memory device 620. The memory device 620 sequentially reads the data stored in the corresponding memory addresses according to the content indicated by the address signal ADDR in response to the control signals, and provides the read data to the register module 640 through the output communication port Q. The register module 640 may comprise one or more registers to sequentially receive data and store the data. The scheduler 642 may sequentially arrange one of the registers to receive the data from the memory device 620 and store the received data in response to the start signal Start.

When the data stored in the register module 640 reaches a certain level, the data stored in the register module 640 are read and output by the scheduler 642 in a serial manner or in a parallel manner, and the read data is output to the bus connected to the host device to provide the data to the host device. In addition, the scheduler 642 may send a notification signal Next (e.g., by generating a corresponding pulse) to the dump controller 612 to notify the dump controller 612 to continue the subsequent read operation.

The dump controller 612 may regenerate the start signal Start (e.g., by generating a corresponding pulse) in response to the reception of the notification signal Next, and trigger pattern generator 611 to continue to arrange a plurality of memory addresses that have not been read in the address signal ADD in response to the start signal Start (which is equivalent to in response to the notification signal Next) and generate the corresponding address signal ADDR, the memory enable signal ME and the read enable signal WE.

According to an embodiment of the invention, the scheduler 642 may also count a predetermined time, for example, count a specific number of clock cycles, and when the predetermined time expires, the data stored in the register module 640 are read and output by the scheduler 642 in a serial manner or in a parallel manner, and the read data is output to the bus connected to the host device to provide the data to the host device. In addition, the scheduler 642 may send a notification signal Next (e.g., by generating a corresponding pulse) to the dump controller 612 to notify the dump controller 612 to continue the subsequent read operation.

According to an embodiment of the invention, the predetermined time or the specific number may be related to the number of registers configured in the register module 640. For example, if there are three registers comprised in the register module 640, in response to the reception of the start signal Start, the scheduler 642 may repeatedly count for 3 clock cycles, and every time when 3 clock cycles have been counted, the scheduler 642 reads out the data stored in the three registers and generate a pulse of the corresponding notification signal Next to notify the dump controller 612 to continue the subsequent read operation.

It should be noted that the register module 640 may also be implemented by a first-in-first-out (FIFO) circuit, and in such implementation, the start signal Start and the notification signal Next may be respectively provided as indicators, to respectively indicate the operations of writing data into the FIFO circuit and outputting data from the FIFO circuit.

Figure 7:
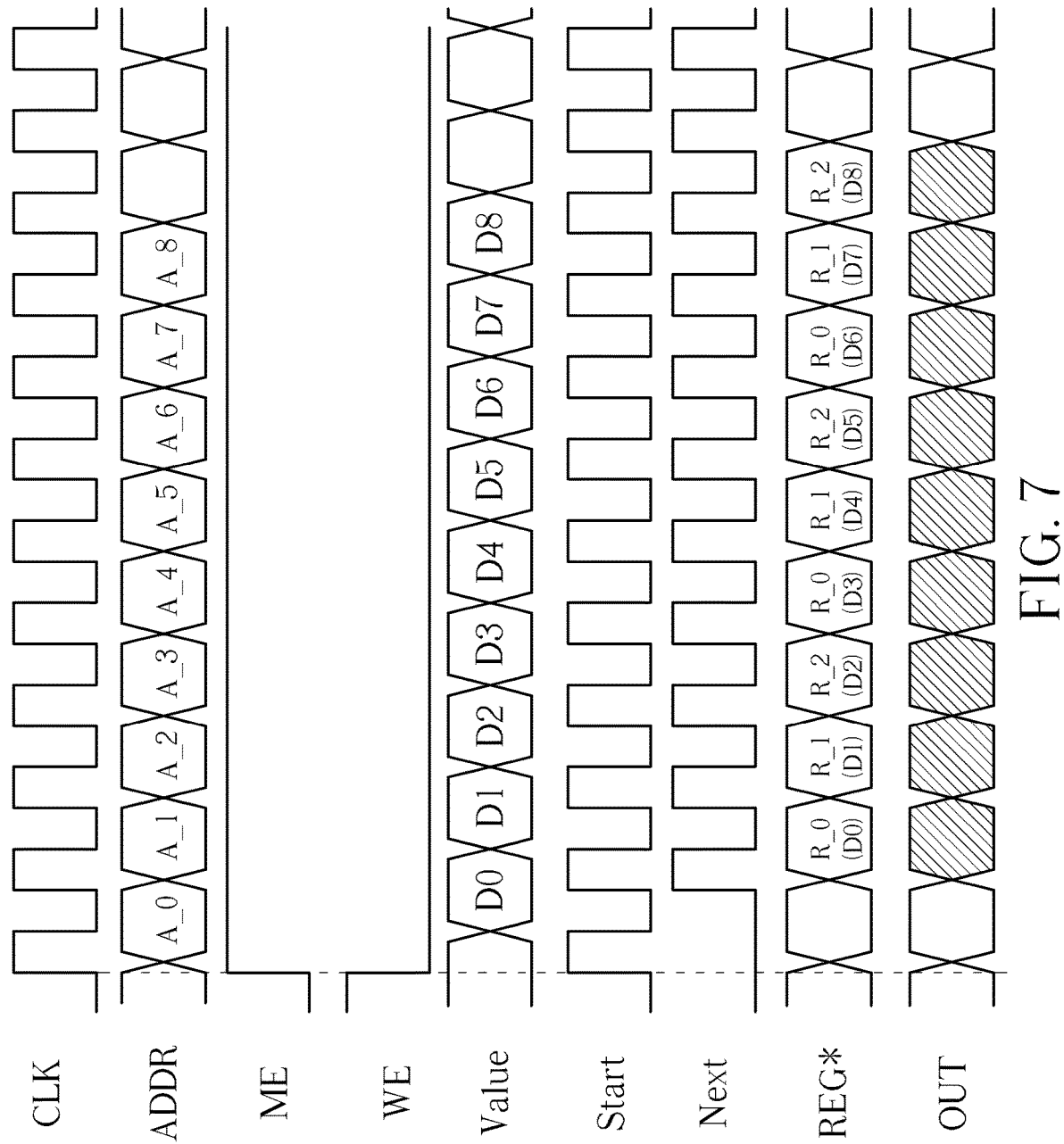
FIG. 7 shows exemplary waveforms of the serial output of multiple pieces of data of the memory device under the control of the test circuit according to an embodiment of the invention.

FIG. 7 shows exemplary waveforms of the serial output of multiple pieces of data of the memory device under the control of the test circuit according to an embodiment of the invention. In FIG. 7, not only the waveforms of the clock signal CLK of the processor, the address signal ADDR, the memory enable signal ME, the read enable signal WE, the start signal Start, and the notification signal Next are shown, but also the waveforms of signals at the output communication port Q of the memory device such as the signal Value, the data signal REG* written in the registers, and the signal OUT transmitted on the bus connected between the register module and the host device are shown.

As shown in FIG. 7, in response to the pulse of the start signal Start, the pattern generator generates the corresponding control signals, and the memory device sequentially outputs the pieces of data D0-D8 read from the addresses A_0-A_8 based on the settings of the control signals, wherein each output is performed in one clock cycle of the clock signal CLK. Assuming that there are three registers comprised in the register module, which are respectively numbered by REG_0, REG_1 and REG_2, and the waveform of the data signal REG* of the registers is represented by simplified register numbers R_0-R_2 with the data D0-D8 marked in brackets to indicate the data written into each register in different clock cycles. In this embodiment, the register module sequentially outputs the received data to the bus. Therefore, the signal OUT transmitted on the bus has valid data in the corresponding clock cycle, which is filled with slashes in FIG. 7 to represent valid data on the bus. In this embodiment, the data D0-D8 corresponding to memory addresses A_0-A_8 will be sequentially read in 9 consecutive clock cycles, and will be sequentially output to the bus in 9 consecutive clock cycles, and the scheduler generates a pulse in the corresponding notification signal Next every time when it finishes counting one clock cycle, so as to notify the dump controller to continue the subsequent read operation. Therefore, in the embodiment of serial output, because the test circuit completes the read operation of one piece of data within one clock cycle of the processor, N pieces of data are continuously output in adjacent N clock cycles, wherein N is a positive integer.

Figure 8:
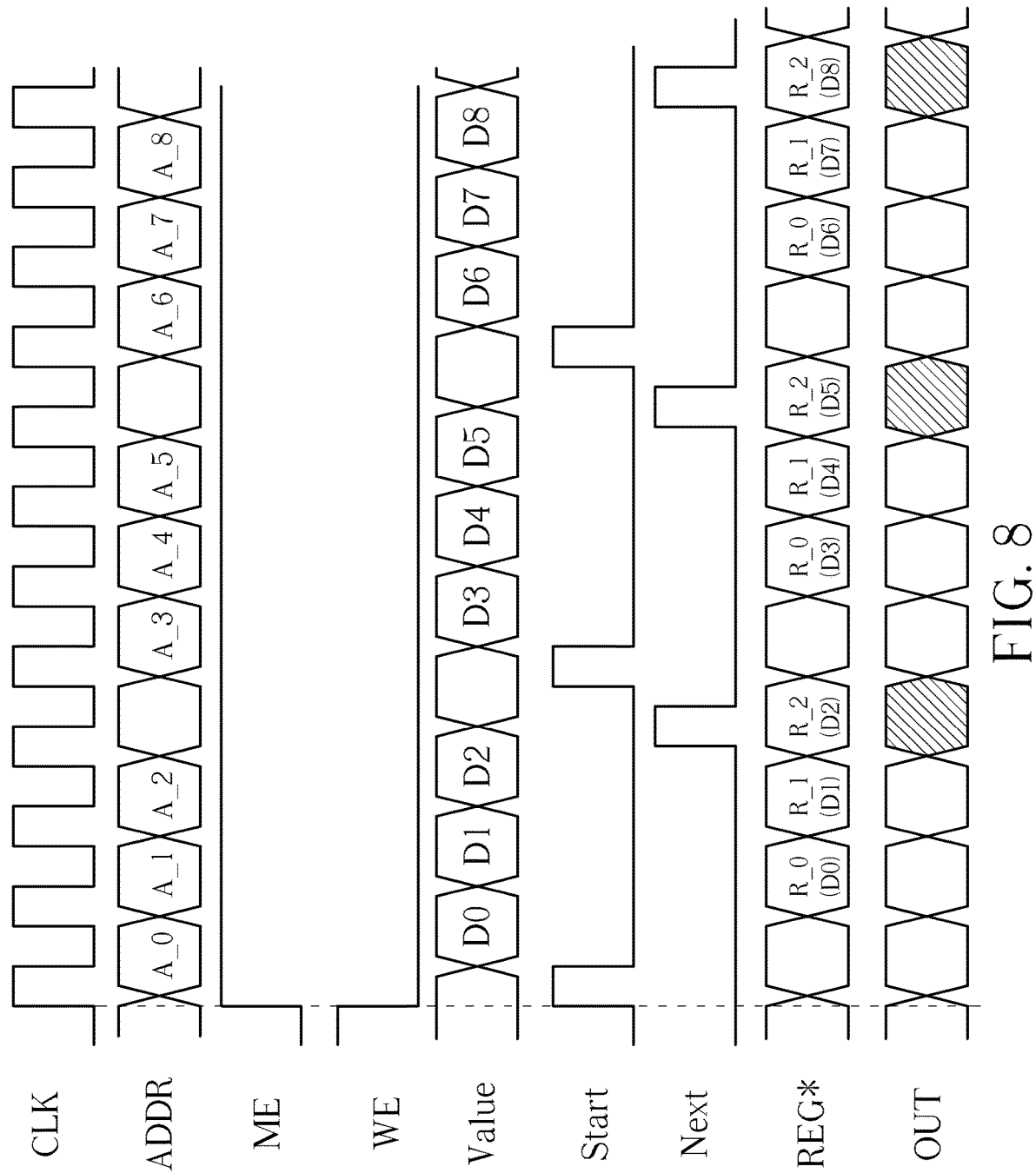
FIG. 8 shows exemplary waveforms of the parallel output of multiple pieces of data of the memory device under the control of the test circuit according to an alternative embodiment of the invention.

FIG. 8 shows exemplary waveforms of the parallel output of multiple pieces of data of the memory device under the control of the test circuit according to an alternative embodiment of the invention. In this embodiment, the pieces of data that have been written in the registers REG_0-REG_2 in different clock cycles, such as the data grouped in each of the following brackets: {R_0(D0), R_1(D1) and R_2(D2)}, {R_0(D3), R_1(D4) and R_2(D5)}, {R_0(D6), R_1(D7) and R_2(D8)}, etc. will be output to the bus in parallel at the same time. Therefore, the signal OUT transmitted on the bus only has valid data in the clock cycle when the data is output. In this embodiment, in response to the pulse of the start signal Start, the pattern generator generates the corresponding control signals, and the scheduler generates the pulse of the corresponding notification signal Next after the reading of data stored in the registers is completed or after counting at least 3 clock cycles, to notify the dump controller to continue the subsequent read operation. In the embodiment of parallel output, since the test circuit completes the read operation of one piece of data within one clock cycle of the processor, the memory device may continuously output M pieces of data in adjacent M clock cycles, wherein M is a positive integer, and the scheduler may output data to the bus in parallel after the M pieces of data have been written into the register, for example, after counting M clock cycles, so that the M pieces of data are output to the bus at the same time in a parallel manner.

In the embodiments of the invention, the host device only needs to send the signal to switch operation modes, and when it is switched to the memory dump mode to perform memory dump, the test circuit configured in the chip under test sequentially performs the read operations on different memory addresses to read the corresponding values, without the need of issuing the corresponding read command for each memory address by the processor. That is, upon receiving the signal to switch the operation mode, the processor comprised in the chip under test only needs to perform the operations of setting the value of the setting signal Memory_Dump_Mode, and does not have to participate in the data read operation of the memory. In response to the setting of the memory dump mode (for example, setting the value of the setting signal Memory_Dump_Mode to a predetermined value), the test circuit automatically generates corresponding control signals, comprising the address signal ADDR with a plurality of memory addresses arranged in a plurality of consecutive clock cycles of the processor, and controls the memory device to only perform the corresponding read operations in the memory dump mode. In this manner, the execution time of memory dump can be greatly shortened by applying the proposed circuit and the corresponding method as compared with the conventional design. In addition, the MBIST circuit which is generally configured for memory devices may be directly applied as the proposed test circuit without adding an additional memory dump circuit or a circuit dedicated for memory dump operation. Therefore, although the memory dump operation is performed by hardware circuits in the embodiments of the invention, no additional circuit area is actually required, which shows that the proposed solution is also a low circuit area solution.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A test circuit, coupled to a memory device and configured to read data stored in the memory device during a memory dump operation, comprising:
    a dump controller, configured to trigger a pattern generator to start a pattern generating operation in response to a setting of a memory dump mode performed by a processor; and
    the pattern generator, configured to generate a plurality of control signals in the pattern generating operation and provide the plurality of control signals to the memory device,
    wherein the plurality of control signals at least comprise an address signal, a memory enable signal and a read enable signal, the address signal comprises a plurality of memory addresses arranged in a plurality of consecutive clock cycles of the processor to read the data stored in the plurality of memory addresses in the plurality of consecutive clock cycles.

2. The test circuit of claim 1, wherein the test circuit finishes a predetermined number of read operations within the predetermined number of clock cycles of the processor.

3. The test circuit of claim 1, further comprising:
    a multiplexer, configured to select and output one of a plurality of input sources, wherein the plurality of input sources comprise the plurality of control signals generated by the pattern generator and a function input signal generated by the processor, and in response to the setting of the memory dump mode, the multiplexer outputs the plurality of control signals to the memory device.

4. The test circuit of claim 1, further comprising:
    at least one register, coupled to the memory device and configured to sequentially receive and store the data.

5. The test circuit of claim 1, wherein the dump controller further generates a start signal in response to the setting of the memory dump mode, and the test circuit further comprises:

a register module, coupled to the memory device and comprising:
  a plurality of registers, configured to sequentially receive and store the data; and
  a scheduler, configured to schedule reception of the data, wherein the scheduler sequentially arranges one of the plurality of registers to receive the data from the memory device in response to the start signal.

6. The test circuit of claim 5, wherein the scheduler is further configured to count a predetermined time, the predetermined time is related to a number of the plurality of registers, and when the predetermined time expires, the scheduler is further configured to read out the data stored in the plurality of registers and send a notification signal.

7. The test circuit of claim 6, wherein the pattern generator is further configured to continue to arrange a plurality of memory addresses that have not been read in the address signal in response to the notification signal and generate the corresponding address signal, the memory enable signal and the read enable signal.

8. A method for reading data stored in a memory device during a memory dump operation, comprising:
  generating a plurality of control signals in response to a setting of a memory dump mode performed by a processor, wherein the plurality of control signals at least comprise an address signal, a memory enable signal and a read enable signal, and the address signal comprises a plurality of memory addresses arranged in a plurality of consecutive clock cycles of the processor to read the data stored in the plurality of memory addresses in the plurality of consecutive clock cycles;
  providing the plurality of control signals to the memory device; and
  sequentially reading the data stored in the plurality of memory addresses in the plurality of consecutive clock cycles in response to the plurality of control signals.

9. The method of claim 8, wherein the data stored in a predetermined number of memory addresses is output by the memory device within the predetermined number of clock cycles of the processor.

10. The method of claim 8, further comprising:
  receiving, by a multiplexer, the plurality of control signals and a function input signal generated by the processor, and wherein step of providing the plurality of control signals to the memory device further comprises:
  outputting the plurality of control signals to the memory device in response to the setting of the memory dump mode.

11. The method of claim 8, further comprising:
  sequentially receiving the data from the memory device by at least one register.

12. The method of claim 8, further comprising:
  generating a start signal in response to the setting of the memory dump mode; and
  sequentially arranging one of a plurality of registers to receive the data from the memory device in response to the start signal.

13. The method of claim 12, further comprising:
  counting a predetermined time, wherein the predetermined time is related to a number of the plurality of registers; and
  reading out the data stored in the plurality of registers when the predetermined time expires and sending a notification signal.

14. The method of claim 13, further comprising:
  generating the plurality of control signals in response to the notification signal,
  wherein a plurality of memory addresses that have not been read are continued arranged in the address signal.

* * * * *